(12) United States Patent
Yoshioka

(10) Patent No.: US 10,553,136 B2
(45) Date of Patent: Feb. 4, 2020

(54) DISPLAY APPARATUS

(71) Applicant: YUGEN KAISHA AU ARCHITECTURE STUDIO, Nagano (JP)

(72) Inventor: Kazuei Yoshioka, Nagano (JP)

(73) Assignee: YUGEN KAISHA AU ARCHITECTURE STUDIO, Nagano (JP)

( * ) Notice: Subject to any disclaimer, the term of this patent is extended or adjusted under 35 U.S.C. 154(b) by 0 days.

(21) Appl. No.: 16/081,790

(22) PCT Filed: Jan. 20, 2017

(86) PCT No.: PCT/JP2017/001868
§ 371 (c)(1),
(2) Date: Aug. 31, 2018

(87) PCT Pub. No.: WO2018/008173
PCT Pub. Date: Jan. 11, 2018

(65) Prior Publication Data
US 2019/0096294 A1    Mar. 28, 2019

(30) Foreign Application Priority Data

Jul. 4, 2016  (JP) ................................. 2016-132147
Jul. 22, 2016 (JP) ................................. 2016-143927

(51) Int. Cl.
*G09F 13/18*    (2006.01)
*G09F 7/18*     (2006.01)
*H01L 33/60*    (2010.01)

(52) U.S. Cl.
CPC .............. *G09F 13/18* (2013.01); *G09F 7/18* (2013.01); *H01L 33/60* (2013.01)

(58) Field of Classification Search
CPC ............. G09F 13/18; G09F 2013/1831; G09F 2013/1836; G09F 2013/184;
(Continued)

(56) References Cited

U.S. PATENT DOCUMENTS

2004/0095741 A1* 5/2004 Chen .................... G02B 6/0031
                                                    362/604
2014/0022484 A1* 1/2014 Kuo .................. G02F 1/133308
                                                     349/58
(Continued)

FOREIGN PATENT DOCUMENTS

CN      104167161 A     11/2016
JP      S46-010270      4/1971
(Continued)

OTHER PUBLICATIONS

Office Action issued in China family member Patent Appl. No. 2016111091380.0, dated Mar. 4, 2019, along with an English translation thereof.
(Continued)

*Primary Examiner* — Cassandra Davis
(74) *Attorney, Agent, or Firm* — Greenblum & Bernstein, P.L.C.

(57) ABSTRACT

A display apparatus includes: a substrate; a strip-like light source placed at ends in a width direction of the substrate; and a light guide plate mounted in front of the substrate. A display medium is disposed in front of the light guide plate. The substrate includes a main body and a pair of edge plates that cover the front surface of both ends in the width direction. Light source mounts formed separately to the substrate and the edge plates have a strip-like light source mounted thereupon and are fixed inside the insertion channels. The light guide plate is mounted with both ends inserted inside the insertion channels so that light from the
(Continued)

strip-like light source is incident from end surfaces of the light guide plate.

12 Claims, 9 Drawing Sheets

(58) Field of Classification Search
CPC ..... G09F 2013/1872; G09F 2013/1881; G02B 6/0086; G02F 2001/133317; G02F 2001/133314
See application file for complete search history.

(56) References Cited

U.S. PATENT DOCUMENTS

2015/0153609 A1* 6/2015 Kim .................. G02F 1/133308
362/606
2016/0231500 A1 8/2016 Kuromizu et al.

FOREIGN PATENT DOCUMENTS

| JP | H03-203772 | 9/1991 | |
|----|----|----|----|
| JP | H09-127896 | 5/1997 | |
| JP | 2004-157204 | 6/2004 | |
| JP | 2010-033862 | 2/2010 | |
| JP | 2012-037643 | 2/2012 | |
| JP | 5610499 | 9/2014 | |
| WO | 2015/045814 | 4/2015 | |
| WO | 2015-174339 | 11/2015 | |
| WO | WO-2015174339 A1 * | 11/2015 | ............. G09F 13/18 |

OTHER PUBLICATIONS

Official Communication issued in European Patent Office (EPO) Patent Application No. 17823782.2, dated Sep. 19, 2019.

* cited by examiner

DISPLAY APPARATUS

FIELD OF THE INVENTION

The present invention relates to a display apparatus configured so that light emitted from a strip-like light source disposed at an edge in the width direction of a substrate, which is shaped as a rectangular plate when viewed from in front, is guided to every position in the width direction by a light guide plate and passes through a display medium disposed on a front side of a light guide plate.

BACKGROUND ART

As an example of a display apparatus of this type, in Japanese Patent No. 5,610,499 the present applicant disclosed a display apparatus for advertising on utility poles. This display apparatus is configured so that when mounted on the outer circumferential surface of a utility pole, a light guide plate emits light across a plane so as to illuminate (or "backlight") an advertising medium (display medium), which is disposed on the front side of the light guide plate, from the rear. More specifically, the signboard apparatus disclosed by the present applicant includes a frame (substrate), LED light sources (or "strip-like light sources"), a light guide plate, a transparent display board (or "surface plate" or "cover plate"), a first spacer, a second spacer, and the like.

The frame includes a mounting frame that is curved in keeping with the outer circumferential form of a utility pole and a display frame that has a display window portion formed in a center thereof and is fixed to the mounting frame so as to be disposed on the front side of the mounting frame. A white coating is applied to the front surface of the mounting frame so that the surface functions as a reflective surface. Bent-over portions that are bent over toward the front are formed at both end portions in the width direction of the mounting frame to provide spaces that house the LED light sources, the two spacers, and the like.

The LED light sources are housed in the housing spaces described above in the mounting frame so as to be sandwiched between the two spacers, i.e., the first spacer and the second spacer, and emit light toward the end surfaces (or "incident end surfaces" or "side end surfaces") of the light guide plate. The light guide plate is curved so as to match the reflective surface of the mounting frame and is disposed on the surface side of the mounting frame. This display apparatus is configured so that the posture in which the LED light sources are mounted on the mounting frame is regulated by the two spacers so that light from the LED light sources becomes incident at an angle on the end surfaces of the light guide plate.

The transparent display board is a plate-like member that acts together with the light guide plate to hold the advertising medium and is curved in the same way as the light guide plate. The first spacer and the second spacer are configured of metal rods of an arbitrary diameter that are capable of regulating the mounting posture of the LED light sources on the mounting frame, that is, of regulating the incident angle of light on the end surfaces of the light guide plate attached to the mounting frame. Note that although the display apparatus includes a backing material, a sealing material, and the like aside from the component elements described above, such description of these elements is omitted here.

When assembling this display apparatus, a frame is first fabricated by fixing the display frame to the mounting frame. Next, the light guide plate, both spacers, the transparent display board, and the like are inserted from end portions (openings) in the length direction of the frame. After this, the LED light sources are inserted from the end portions in the length direction of the frame so as to be sandwiched by the two spacers. By doing so, the display apparatus is completed.

With this display apparatus, light that is incident at an angle on the end surfaces of the light guide plate is evenly guided across the entire area of the light guide plate and emitted from the light guide plate. Here, the light emitted toward the rear of the light guide plate is reflected by the reflective surface on the mounting frame so as to pass back through the light guide plate and be emitted to the front of the light guide plate. By doing so, the entire area of the light guide plate emits light and the entire area of the advertising medium disposed between the light guide plate and the transparent display board is brightly illuminated.

PRIOR ART LITERATURE

Patent Literature

Patent Literature 1: Japanese Patent No. 5610499

SUMMARY OF THE INVENTION

Problems to be Solved by the Invention

However, the display apparatus disclosed by the present applicant has the following problem to be solved. That is, with the display apparatus disclosed by the present applicant, the light guide plate, both spacers, the transparent display board, the LED light sources, and the like are integrated by being inserted in order from the end portions in the length direction of the frame which has been produced by integrating the mounting frame and the display frame.

Here, the strip-like light sources (which are LED light sources in the display apparatus disclosed by the present applicant) used in this type of apparatus have various sizes (thicknesses and widths) in keeping with the required properties, like brightness and water resistance. Accordingly, the display apparatus disclosed by the present applicant is configured so that when it becomes necessary to manufacture a display apparatus using LED light sources of a different size to the intended LED light sources in the original design, it is possible, by freely changing the diameters of the first spacer and the second spacer that hold the LED light sources, to set the mounting posture (i.e., the incident angle of light on the end surfaces of the light guide plate) of the LED light sources on the mounting frame in a desired state.

However, a display apparatus of this type can be subjected to vibration and external shocks during transportation after manufacturing and/or after mounting on a utility pole or the like. To prevent the incident angle of light on the light guide plate changing due to movement of the LED light sources and/or the spacers inside the frame, it is necessary to attach the various component elements inside the frame with a sufficiently strong force. This means that the job of inserting the various component elements inside the frame during manufacturing of the display apparatus disclosed by the present applicant is difficult, and this results in more time being required for assembly, which makes it difficult to reduce the manufacturing cost. This problem should preferably be solved.

On the other hand, with the object of making it possible to manufacture a display apparatus easily and in a short time, the present applicant has produced a prototype display apparatus which is equipped, in place of the frame described above fabricated by bending up a plate member, with a frame (substrate) that is fabricated by extrusion molding of aluminum and has an inner surface onto which the LED light sources (strip-like light sources) can be directly stuck. With this prototype display apparatus produced by the present applicant, unlike the display apparatus described above where the LED light sources are held by the first spacer and the second spacer, it is possible, after sticking the LED light sources onto the frame, to insert the light guide plate and the transparent display board and thereby integrate these components. This means that it is possible to favorably avoid positional displacements of the LED light sources due to vibration and/or external shocks, and also possible to manufacture the display apparatus easily and in a short time.

However, when it is necessary to manufacture a display apparatus using LED light sources (strip-like light sources) of a different size to the intended LED light sources in the original design, it becomes necessary to newly fabricate a frame (substrate) where the parts (hereinafter referred to as the "light source mounting portions") used for sticking the LED light sources have a different size and/or form in keeping with the size of the LED light sources and the emission direction of light. Here, since molds for extrusion molding large members like a frame are extremely costly, the component cost when fabricating various types of frame (substrates) with light source mounting portions of different sizes and/or forms becomes expensive. This means that even though the prototype display apparatus produced by the present applicant attempts to reduce the manufacturing cost by reducing the time required by assembly, there is the problem that it is difficult to reduce the manufacturing cost of the display apparatus due to the increased component cost of the frame when LED light sources of different sizes are used.

The present invention was conceived in view of the problems described above and has a principal object of providing a display apparatus that can be manufactured easily and in a short time and can also avoid a situation where the manufacturing cost increases when various types of strip-like light source are used.

Means for Solving the Problems

To achieve the stated object, a display apparatus according to claim 1 of the present invention comprises: a substrate shaped as a rectangular plate when viewed from a front side thereof; a strip-like light source mounted on at least one out of both ends in a width direction of the substrate; and a light guide plate which is disposed across a front surface of the substrate, is mounted on the substrate, and guides light emitted from the strip-like light source to every part in the width direction of the substrate; wherein the display apparatus is configured so that a display medium is capable of being disposed on a front surface side of the light guide plate, the substrate includes: a main body that is shaped as a rectangular plate when viewed from a front side thereof; and a pair of edge plates that are provided at both ends in a width direction of the main body and cover the front surface side of both ends in a width direction of the light guide plate, both ends of the main body and both edge plates form a pair of insertion channels into which the light guide plate is capable of being inserted, the substrate further includes a light source mount that is formed separately to the main body and the edge plates, is capable of having a strip-like light source mounted thereupon, and is fixed to at least one of the main body and the edge plates in a state where the light source mount has been disposed inside the insertion channels, and the light guide plate is mounted on the substrate in a state where both ends in the width direction have been inserted inside the insertion channels in a state where light from the strip-like light source mounted on the light source mount is incident from end surfaces in the width direction of the light guide plate.

Therefore, according to the display apparatus according to claim 1, since it is possible to position the strip-like light source by first mounting the strip-like light source in advance on the light source mount and then mounting the light source mount on at least one of the main body and the edge plates, it is possible, even for workers unused to assembling this type of apparatus, to manufacture the display apparatus easily and in a short time. By doing so, it is possible to sufficiently reduce the manufacturing cost of the display apparatus. When using various types of strip-like light source that differ in size or the like, by fabricating the light source mounts in keeping with the strip-like light sources, it is possible to manufacture display apparatuses that use the same main body and edge plates whose component cost is quite high. This means that it is possible to significantly reduce the manufacturing cost of the display apparatus by an amount saved by not needing to fabricate a new substrate in keeping with the strip-like light sources in use.

In the display apparatus according to claim 2, the light source mount is equipped with a movement restricting step that restricts movement in the width direction of the light guide plate relative to the substrate.

Therefore, according to the display apparatus according to claim 2, since the end surfaces will not come into contact with the strip-like light source even when the light guide plate tries to move relative to the substrate due to vibration or an external shock applied to the display apparatus, it is possible to favorably avoid the strip-like light source being broken by the light guide plate.

The display apparatus according to claims 3 and 4 further comprises a surface plate that is disposed across the front surface side of the light guide plate and acts together with the light guide plate to hold the display medium, wherein the insertion channels of the substrate are formed so that both the light guide plate and the surface plate are capable of being inserted.

Therefore, according to the display apparatuses according to claims 3 and 4, it is possible to favorably avoid wetting and damage to the display medium covered by the surface plate, and compared to a configuration where the surface plate is disposed on the front side of the edge plates (for example, a configuration where fixing screws inserted through the surface plate are screwed into the edge plates to fix the surface plate in a state where end surfaces of the surface plate are visible), it is possible to sufficiently improve the appearance of the display apparatus and to favorably avoid accidents where the surface plate comes off due to vibration or an external shock applied to the display apparatus.

In the display apparatus according to claims 5 and 6, a cross-sectional form in the width direction of the main body is curved into an arc, and the light guide plate is curved across the front surface of the main body.

Therefore, according to the display apparatuses according to claims 5 and 6, it is possible to mount the display apparatus around the circumferential surface of a cylindrical (or barrel-shaped) mounted object. By doing so, it is possible, without affecting the appearance or functioning of the mounted object, to produce an eye-catching display where it appears as if part of the circumferential surface of the mounted object (i.e., the part where the display apparatus is mounted) is emitting light. Although assembly work may appear difficult due to the entire form being curved, since mounting on the substrate is possible by mounting the light source mount, onto which the strip-like light source has been mounted in advance, on at least one of the main body and the edge plates and then inserting both ends of the light guide plate into the insertion channels, it is possible, even for workers unused to the task, to manufacture the display apparatus easily and in a short time.

The display apparatus according to claims 7 and 8, further comprises a surface plate that is curved in a width direction thereof, is disposed across the front surface side of the light guide plate, and acts together with the light guide plate to hold the display medium, and the insertion channels of the substrate are formed so that both the light guide plate and the surface plate are capable of being inserted.

Therefore, according to the display apparatuses according to claims 7 and 8, it is possible to favorably avoid wetting and damage to the display medium covered by the surface plate, and compared to a configuration where the surface plate is disposed on the front side of the edge plates (for example, a configuration where fixing screws inserted through the surface plate are screwed into the edge plates to fix the surface plate in a state where end surfaces of the surface plate are visible), it is possible to sufficiently improve the appearance of the display apparatus and to favorably avoid accidents where the surface plate comes off due to vibration or an external shock applied to the display apparatus.

In the display apparatus according to claims 9 to 12, the light source mounts is provided with a holding rib that is positioned between the light guide plate and the surface plate, acts together with the main body to hold the light guide plate, and acts together with the edge plates to hold the surface plate.

Therefore, according to the display apparatuses according to claims 9 to 12, it is possible to reliably separate the light guide plate and the surface plate by the thickness of the holding ribs to produce a gap between the light guide plate and the surface plate, which makes it possible to smoothly insert the display medium into the gap.

It should be noted that the disclosure of the present invention relates to the contents of Japanese Patent Application No. 2016-132147 that was filed on Jul. 4, 2016 and Japanese Patent Application No. 2016-143927 that was filed on Jul. 22, 2016, the entire contents of which are herein incorporated by reference.

MODE FOR CARRYING OUT THE INVENTION

Preferred embodiments of a display apparatus according to the present invention are described below with reference to the attached drawings.

Figure 1:
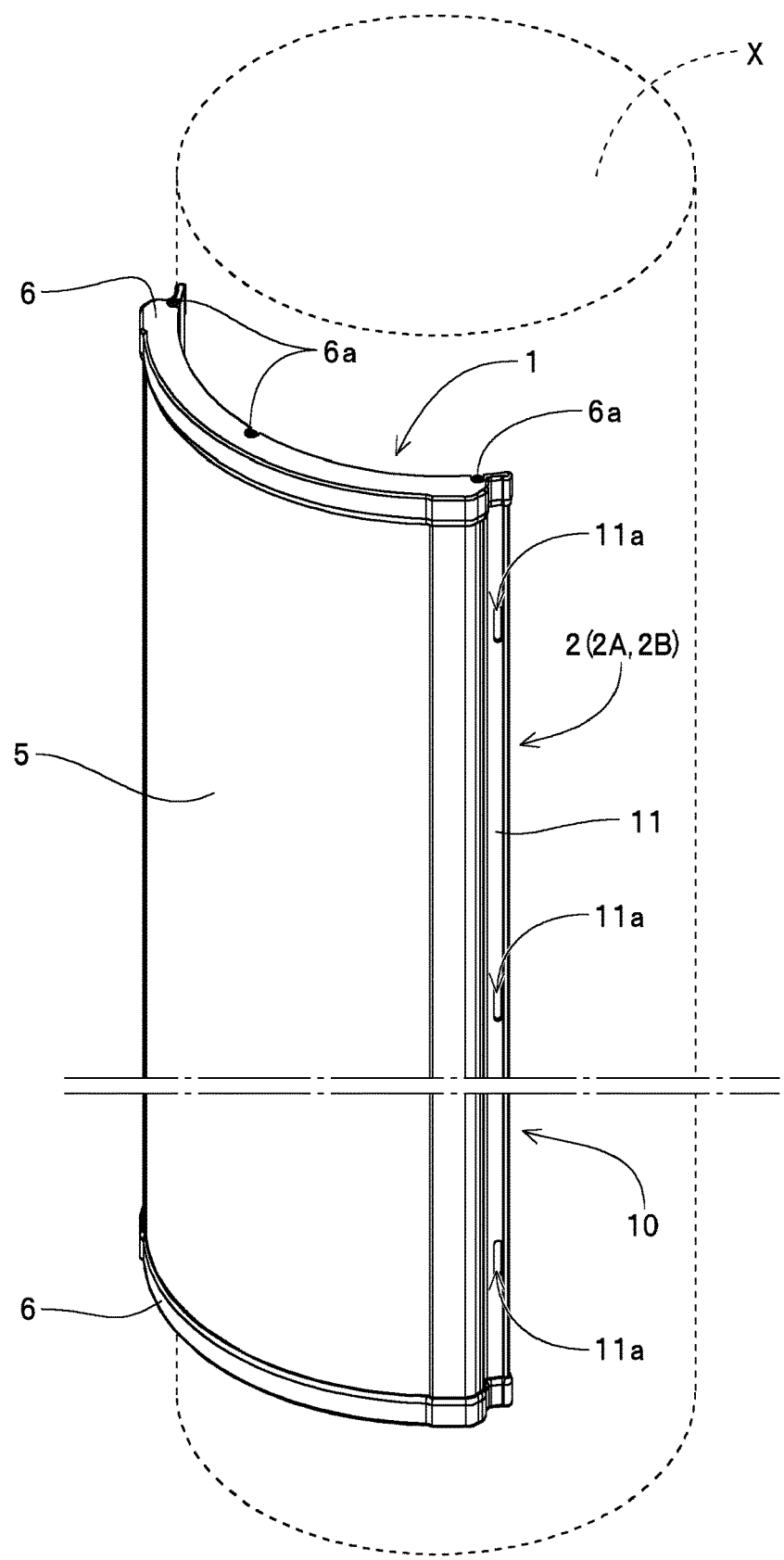
FIG. 1 An external perspective view of a signboard apparatus 1 that has been mounted on a mounted object X.

A signboard apparatus 1 depicted in FIG. 1 is one example of a "display apparatus" and, in the same way as the display apparatus disclosed by the present applicant in the patent document mentioned above and the prototype display apparatus produced by the present applicant, is configured so as to be capable, when mounted on a mounted object X such as a utility pole, of producing a display by emitting light onto a display medium (or "advertising medium": a member where arbitrary images and characters are printed on paper or a film) from a rear surface side thereof. More specifically, as depicted in FIGS. 2 to 4, the signboard apparatus 1 includes a substrate 2, a pair of LED boards 3, a light guide plate 4, a cover plate 5, a pair of caps 6, and a controller unit, not shown, that supplies power to (i.e., controls illumination of) the LED boards 3.

The substrate 2 is one example of a "substrate" for the present invention and has the overall form of a rectangular plate when viewed from in front. The substrate 2 includes a main member 10 and a pair of LED mounts 20. The main member 10 has a main body 11 and a pair of edge plates 12, 12 provided at both ends of the main body 11, which are integrally formed by extrusion molding using aluminum.

The main body 11 is one example of a "main body" and has a cross-sectional form in the width direction (the left-right direction in FIGS. 2 and 4) that is curved into an arc in keeping with the form of the circumferential surface of the mounted object X. Here, with the signboard apparatus 1 (the substrate 2) according to the present embodiment, a surface F11 (see FIGS. 3 and 4) on the front side of the main body 11 is provided with a mirror finish or given a white coating, and by doing so, is configured to reflect light, which has been guided by the light guide plate 4, described later, and emitted toward a rear of the light guide plate 4, back toward the surface of the signboard apparatus 1. With the signboard apparatus 1 (the substrate 2) according to the present embodiment, as depicted in FIG. 1, a plurality of insertion through-holes 11a, through which bands used to mount the signboard apparatus 1 on the mounted object X can be inserted, are formed in end portions in the width direction of the main body 11. Note that the bands mentioned above are not illustrated in the drawings.

Figure 2:
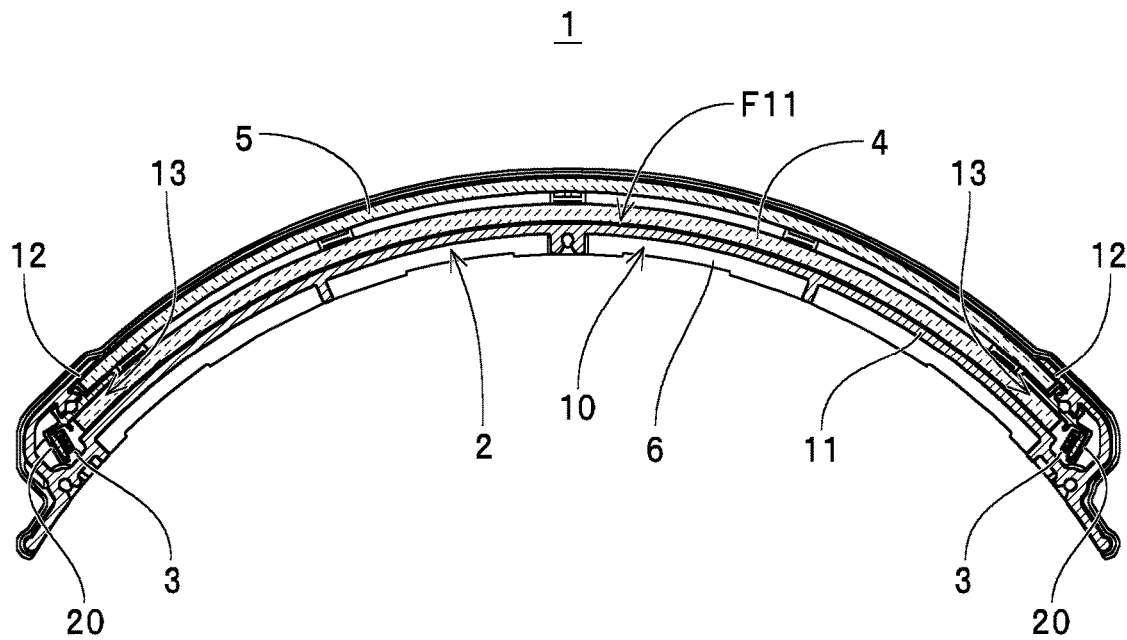
FIG. 2 A cross-sectional view of the signboard apparatus 1.
Figure 3:
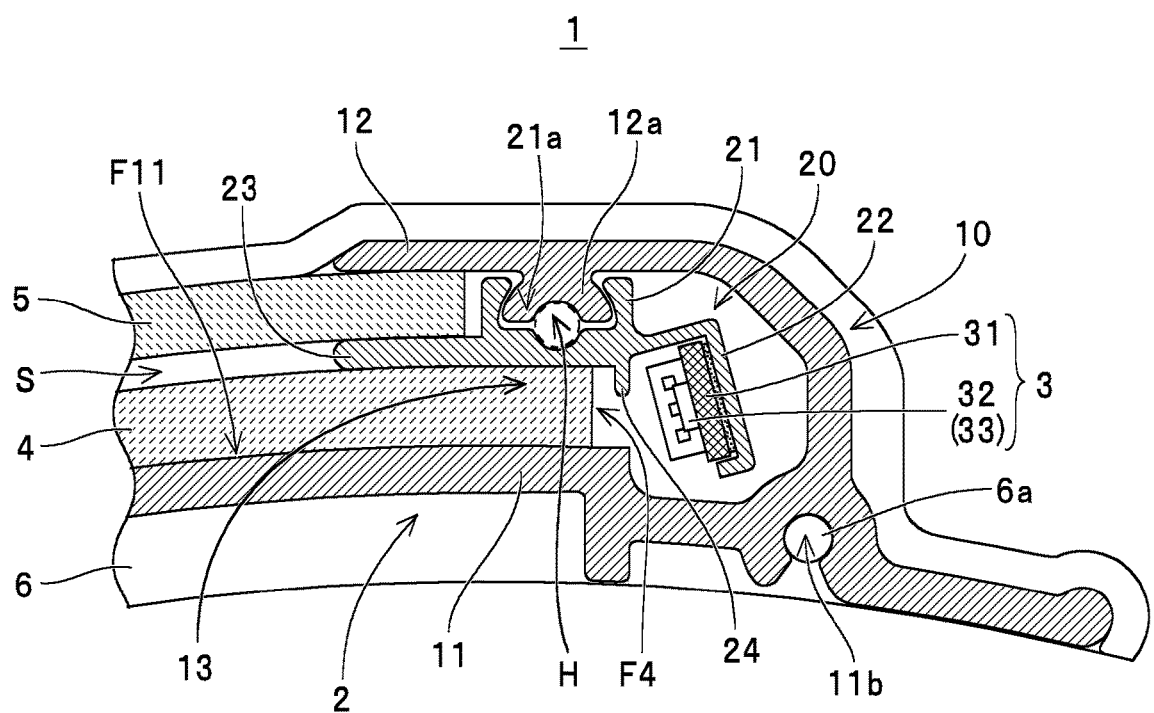
FIG. 3 A cross-sectional view of a part at an end portion in a width direction of the signboard apparatus 1.
Figure 4:
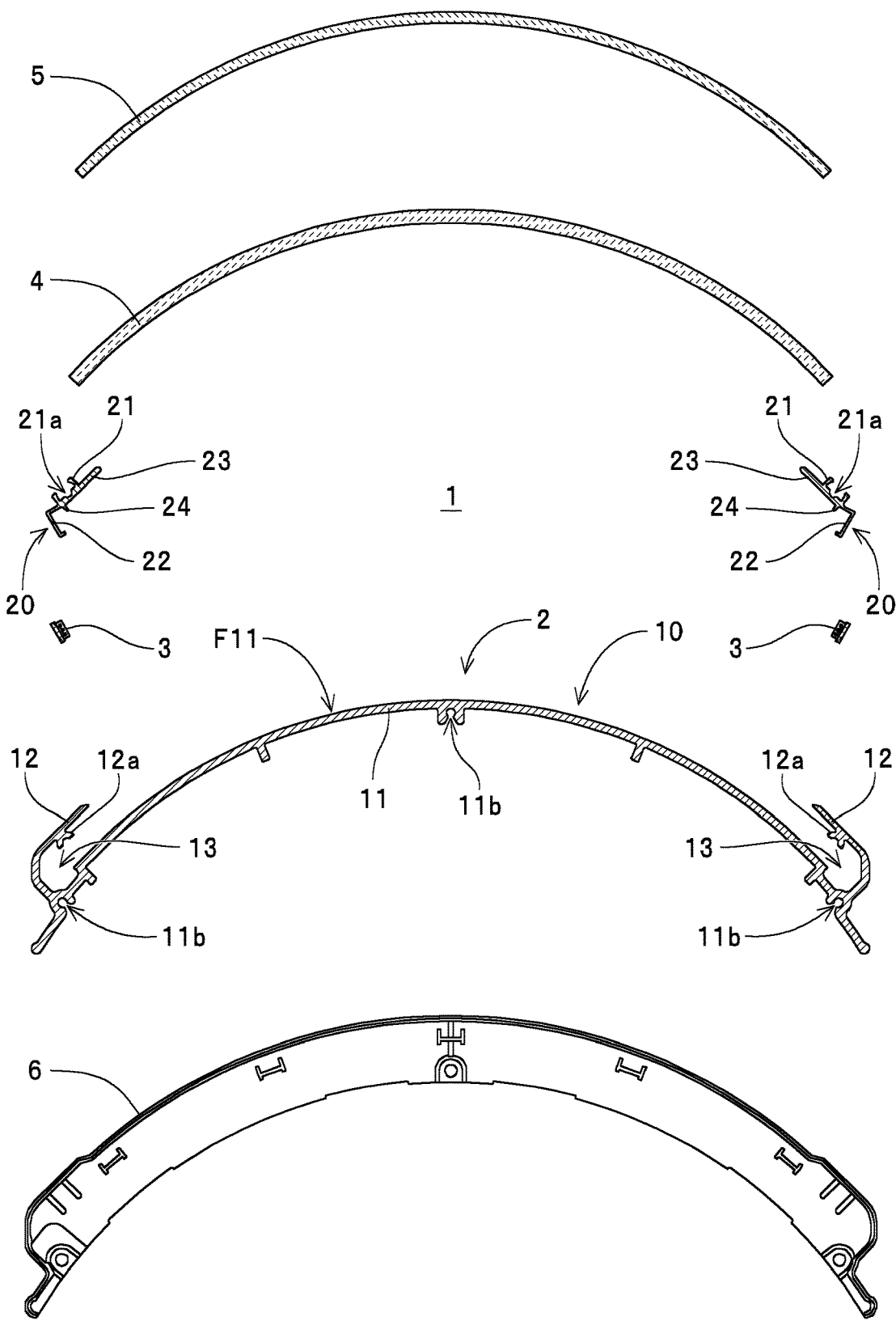
FIG. 4 An exploded perspective view of the signboard apparatus 1.

The edge plates 12 are one example of "edge plates" for the present invention, and as depicted in FIGS. 2 and 3, are formed at both ends in the width direction of the main body 11 so as to cover the front side (the upper surfaces in FIGS.

2 and 3) of both ends in the width direction of the light guide plate 4 and the cover plate 5. Here, with the signboard apparatus 1 (the substrate 2) according to the present embodiment, insertion channels 13 that correspond to "insertion channels" for the present invention are formed by the ends in the width direction of the main body 11 described above and the edge plates 12. With the signboard apparatus 1 (the substrate 2) according to the present embodiment, as depicted in FIG. 3, a mounting convex portion 12a for attaching an LED mount 20 is formed on the inner surface of each edge plate 12 (i.e., the surface of the edge plate 12 that faces the main body 11).

The LED mounts 20 are one example of "light source mounts" for the present invention and are formed separately to the main member 10 (the main body 11 and the edge plates 12) by extrusion molding using aluminum. As depicted in FIG. 3, each LED mount 20 has a mounting portion 21 for mounting on an edge plate 12 (specifically on a mounting convex portion 12a), a board mounting portion 22 for mounting an LED board 3, a holding rib 23 that fits between the light guide plate 4 and the cover plate 5 as described later, and a movement restricting convex portion 24 that constructs a "movement restricting step" for the present invention, such elements being integrally formed. Here, a mounting concave portion 21a, into which the mounting convex portion 12a of an edge plate 12 can fit, is formed in the mounting portion 21.

Each LED mount 20 is disposed in an insertion channel 13 after an LED board 3 has been attached as described later to the board mounting portion 22, and is fixed to the edge plate 12 (the main member 10) with the mounting convex portion 12a of the edge plate 12 having been fitted into the mounting concave portion 21a of the mounting portion 21 (a configuration that is "fixed to an edge plate" as one example of a configuration that is "fixed to at least one of the main body and the edge plates").

Figure 5:
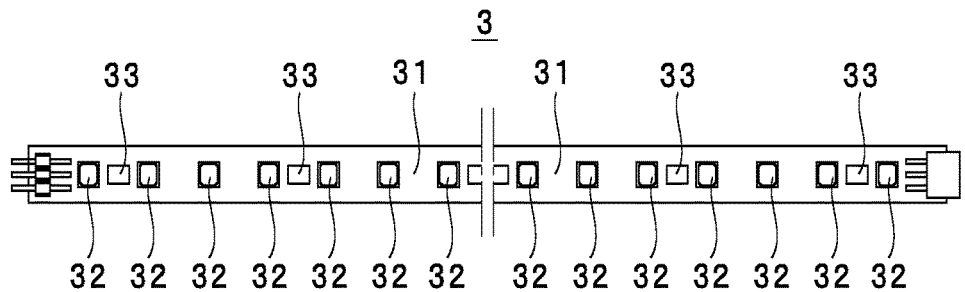
FIG. 5 A plan view of an LED board 3.

Each LED board 3 is one example of a "strip-like light source" for the present invention and, as depicted in FIG. 5, includes a flexible board 31 in the form of a long strip, a plurality of LEDs 32 disposed at equal intervals on a surface of the flexible board 31, and protective components (one example of electronic components) 33 such as resistors or constant current diodes mounted on a surface of the flexible board 31 together with the LEDs 32. With the LED boards 3, the LEDs 32 are mounted on the flexible board 31 so as to be capable of emitting light in a direction that is perpendicular to the plane of the flexible board 31. Here, with the signboard apparatus 1 according to the present embodiment, LED boards 3 are mounted at both ends in the width direction of the substrate 2 (a "mounted on both ends in the width direction of the substrate" configuration as one example of a "mounted on at least one out of both ends in a width direction of the substrate" configuration).

The light guide plate 4 is one example of a "light guide plate" and, as depicted in FIGS. 2 and 4, is curved so as to follow the front surface F11 of the main body 11 of the substrate 2. As depicted in FIG. 2, the light guide plate 4 is disposed on the front side of the main body 11 of the substrate 2 and guides light emitted from the LED boards 3 to every position in the width direction of the substrate 2. Here, as depicted in FIG. 3, the light guide plate 4 is attached to the substrate 2 with both ends in the width direction inserted inside the insertion channels 13 so that light from the LED boards 3, which are disposed inside the insertion channels 13 having been mounted on the LED mounts 20, is incident from the end surfaces F4.

The cover plate 5 is one example of a "surface plate" for the present invention and, as depicted in FIGS. 2 and 4, is curved in the width direction in the same way as the light guide plate 4 described above. As depicted in FIG. 2, the cover plate 5 is disposed on the front side of the light guide plate 4 and is mounted on the substrate 2 so as to be capable of acting together with the light guide plate 4 to hold the display medium. Here, with the signboard apparatus 1 according to the present embodiment, the insertion channels 13 are formed so that the ends of both the light guide plate 4 and the cover plate 5 can be inserted.

The caps 6 are members that cover the ends in the length direction of the substrate 2 (the main member 10 and the LED mounts 20), the LED boards 3, the light guide plate 4, and the cover plate 5, and, as depicted in FIG. 4, are formed in an arc shape using a resin material in keeping with the curved form of the substrate 2, the light guide plate 4, and the cover plate 5. As depicted in FIG. 1, as one example the caps 6 are fixed to the main body 11 of the substrate 2 by screwing fixing screws 6a (see FIGS. 1 and 3) into screw hole portions 11b (see FIGS. 3 and 4) formed in the main body 11.

When manufacturing the signboard apparatus 1, the main member 10 and the LED mounts 20 are separately fabricated by extrusion molding. The light guide plate 4 and the cover plate 5 that are curved in cross section are separately fabricated by hot pressing a resin plate of an arbitrary thickness, and the caps 6 are fabricated by injection molding.

Figure 6:
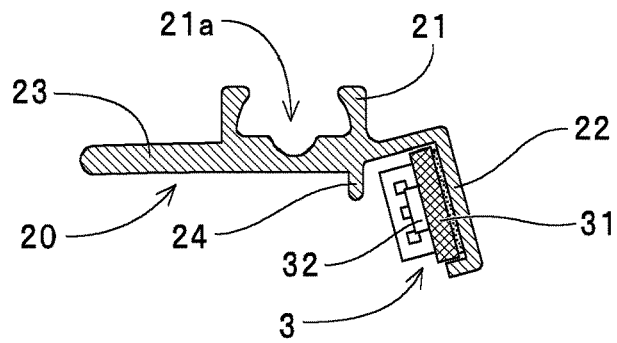
FIG. 6 A diagram useful in explaining an assembly procedure of the signboard apparatus 1.

Next, as depicted in FIG. 6, the LED boards 3 are attached to the board mounting portions 22 of the LED mounts 20. Here, if adhesive tape has been attached to the flexible board 31 of the LED boards 3, the flexible board 31 is stuck to the board mounting portions 22 by removing the liner, but when adhesive tape has not been attached, the board mounting portions 22 are attached to the flexible board 31 by adhesive. Here, unlike when manufacturing a conventional display apparatus where it was necessary to insert LED light sources into an extremely narrow space, it is possible to fix the LED boards 3 to the LED mounts 20 by sticking (with tape or adhesive) the LED boards 3 to the board mounting portions 22 in an exposed (pre-assembly) state, which means that it is possible even for workers unused to this type of task to complete the work easily and in a short time without breaking the LED boards 3.

Figure 7:
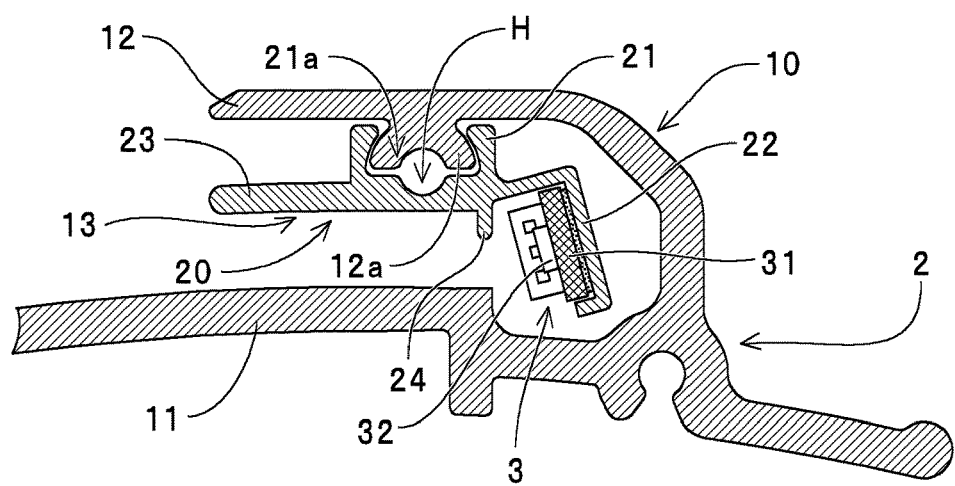
FIG. 7 Another diagram useful in explaining the assembly procedure of the signboard apparatus 1.

Next, as depicted in FIG. 7, the LED mounts 20 are placed inside the insertion channels 13 of the main member 10 so that the mounting convex portion 12a of each edge plate 12 on the main member 10 fits into the mounting concave portion 21a of each mounting portion 21 of the LED mounts 20. With this configuration, a semicircular channel portion formed on the protruding end portion of each mounting convex portion 12a faces a semicircular channel portion formed in the bottom surface of each mounting concave portion 21a so as to form a round hole H as depicted in FIG. 7. A headless screw is then screwed into the round hole H at each end in the length direction of the main member 10 and the LED mounts 20. By doing so, the LED mounts 20 are fixed to the main member 10 (the edge plates 12) to complete the substrate 2 and complete the attachment of the LED boards 3 to the substrate 2.

Figure 8:
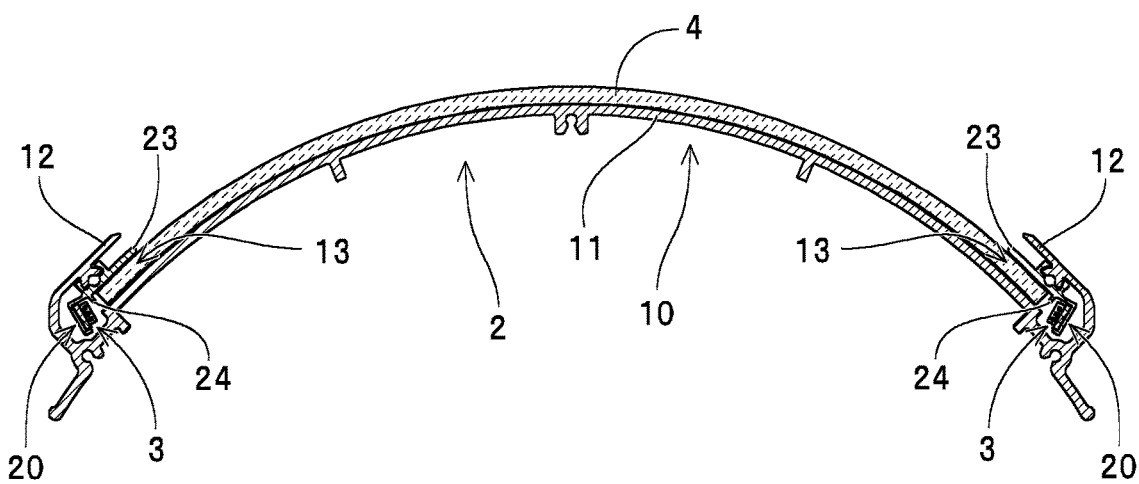
FIG. 8 Yet another diagram useful in explaining the assembly procedure of the signboard apparatus 1.

After this, as depicted in FIG. 8, the light guide plate 4 is mounted on the substrate 2 by inserting both ends in the width direction into the insertion channels 13. When doing so, the light guide plate 4 is mounted so as to be inserted between the main body 11 of the main member 10 and the holding ribs 23 of the LED mounts 20. Here, with the signboard apparatus 1 (the substrate 2) according to the present embodiment, "movement restricting steps" are formed by the movement restricting convex portions 24 formed in the LED mounts 20, and by doing so, movement in the width direction of the light guide plate 4 relative to the substrate 2 is restricted. Accordingly, a situation where an end surface F4 of the light guide plate 4 comes into contact with an LED board 3 attached to an LED mount 20 (a board mounting portion 22) and breaks the LED board 3 is favorably avoided.

Figure 9:
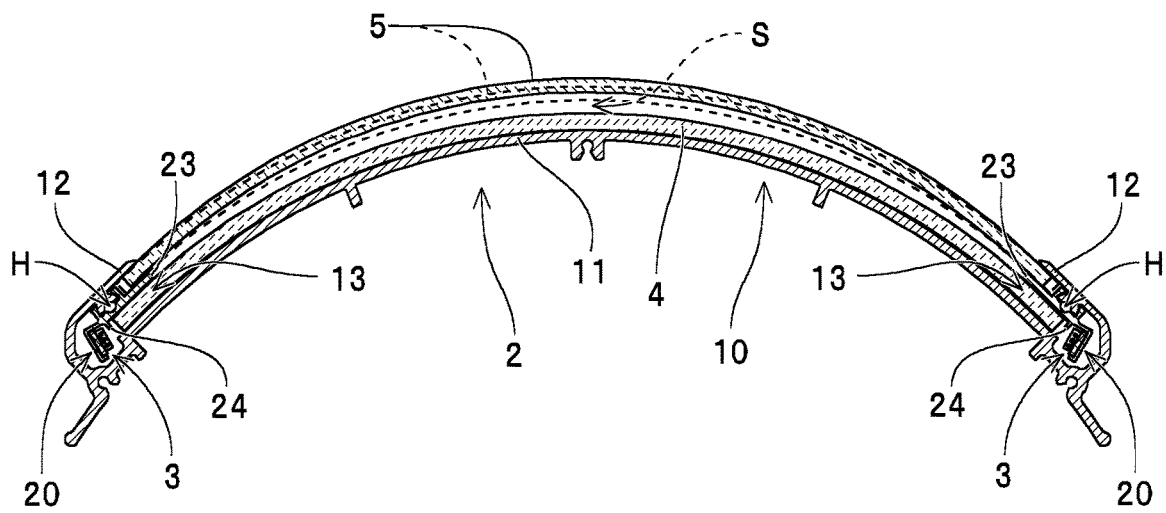
FIG. 9 Yet another diagram useful in explaining the assembly procedure of the signboard apparatus 1.

Next, as depicted in FIG. 9, the cover plate 5 is mounted on the substrate 2 so that both ends in the width direction are inserted into the insertion channels 13 of the substrate 2. When doing so, the cover plate 5 is mounted so as to be inserted between the edge plates 12 of the main member 10 and the holding ribs 23 of the LED mounts 20. Note that although not illustrated or described in detail for ease of understanding the configuration and method of assembling the signboard apparatus 1, as one example, a sealing member (an elastic member capable of reversible deformation) is inserted between the edge plates 12 and the holding ribs 23 before the cover plate 5 is mounted on the substrate 2, and by inserting the cover plate 5 in this state to press and cause deformation of the seal member, it is possible to seal the gap between the substrate 2 (the edge plates 12) and the cover plate 5.

After this, the caps 6 are attached to both ends in the length direction of the substrate 2, the LED boards 3, the light guide plate 4, and the cover plate 5. Here, with the signboard apparatus 1 according to the present embodiment, as depicted in FIG. 9, in a state where the caps 6 are not attached, the cover plate 5 becomes curved so that the gap between the light guide plate 4 and the cover plate 5 becomes larger toward the center in the width direction. By attaching the caps 6 in this state, the cover plate 5 is pressed by the caps 6 so as to elastically deform as depicted by the broken line in FIG. 9. By doing so, in a state where attachment of the caps 6 has been completed, a uniform gap S that is equal to the thickness of the holding ribs 23 is formed between the light guide plate 4 and the cover plate 5. As a result of the above steps, the signboard apparatus 1 is completed as depicted in FIGS. 1 to 3.

When using the signboard apparatus 1, one of the two caps 6 is removed and a display medium is inserted into the gap S between the light guide plate 4 and the cover plate 5. With the above configuration, since the gap S that is equal to the thickness of the holding ribs 23 of the LED mounts 20 is formed between the light guide plate 4 and the cover plate 5, it is possible to smoothly insert the display medium into the gap S. Next, the cap 6 that was removed is reattached to the substrate 2 (the main body 11). By inserting the display medium in this way, it becomes possible to illuminate the display medium from the rear side thereof with light that has been emitted from the LED boards 3 and guided by the light guide plate 4.

On the other hand, when manufacturing a "display apparatus" using a "strip-like light source" whose emission direction (or "light dispersing characteristics") differs to the LED boards 3 in the signboard apparatus 1 described above or a "strip-like light source" whose size (width and/or thickness) differs to the LED boards 3, or when replacing the LED boards 3 of the signboard apparatus 1 with such "strip-like light sources", "light source mounts" are newly fabricated in accordance with the "strip-like light sources" in use.

Figure 10:
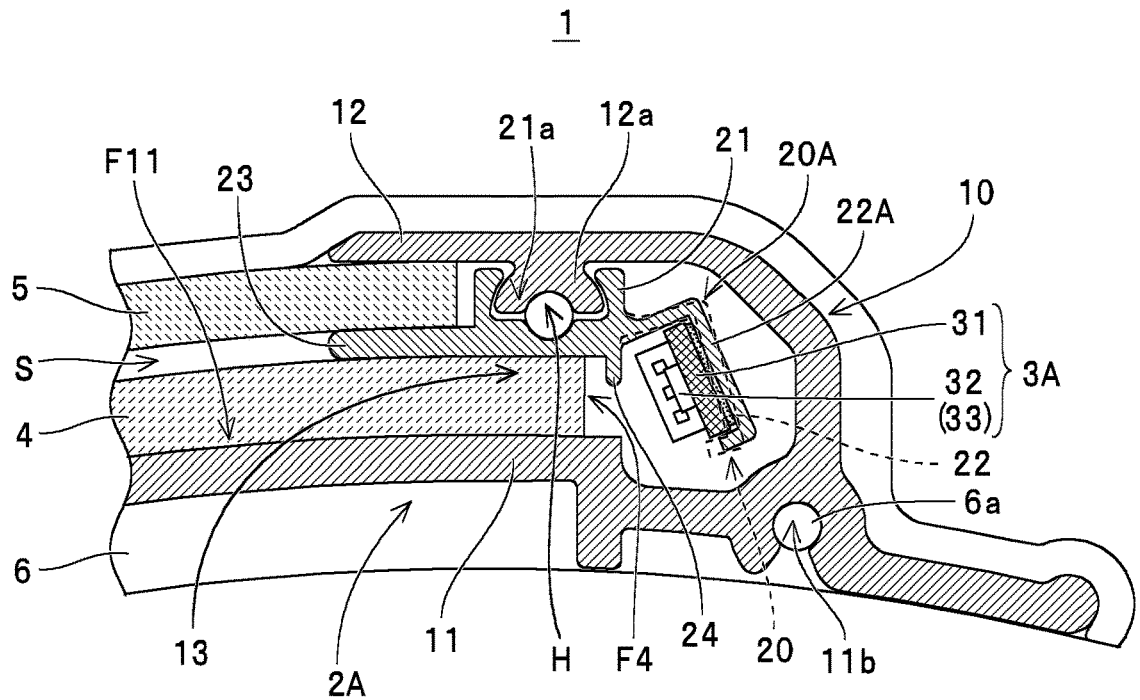
FIG. 10 A cross-sectional view of a signboard apparatus 1 equipped with an LED mount 20A.

More specifically, for the signboard apparatus 1 depicted in FIG. 10, since LED boards 3A whose emission direction (light dispersing characteristics) of light differs to the LED boards 3 described earlier are used, a substrate 2A is configured using LED mounts 20A equipped with board mounting portions 22A that extend at a different angle to the board mounting portions 22 of the LED mounts 20. Note that in the signboard apparatus 1 depicted in FIG. 10 and in the signboard apparatus 1 depicted in FIG. 11 referred to later, component elements with the same functions as in the signboard apparatus 1 described above have been assigned the same reference numerals and description thereof is omitted.

Figure 11:
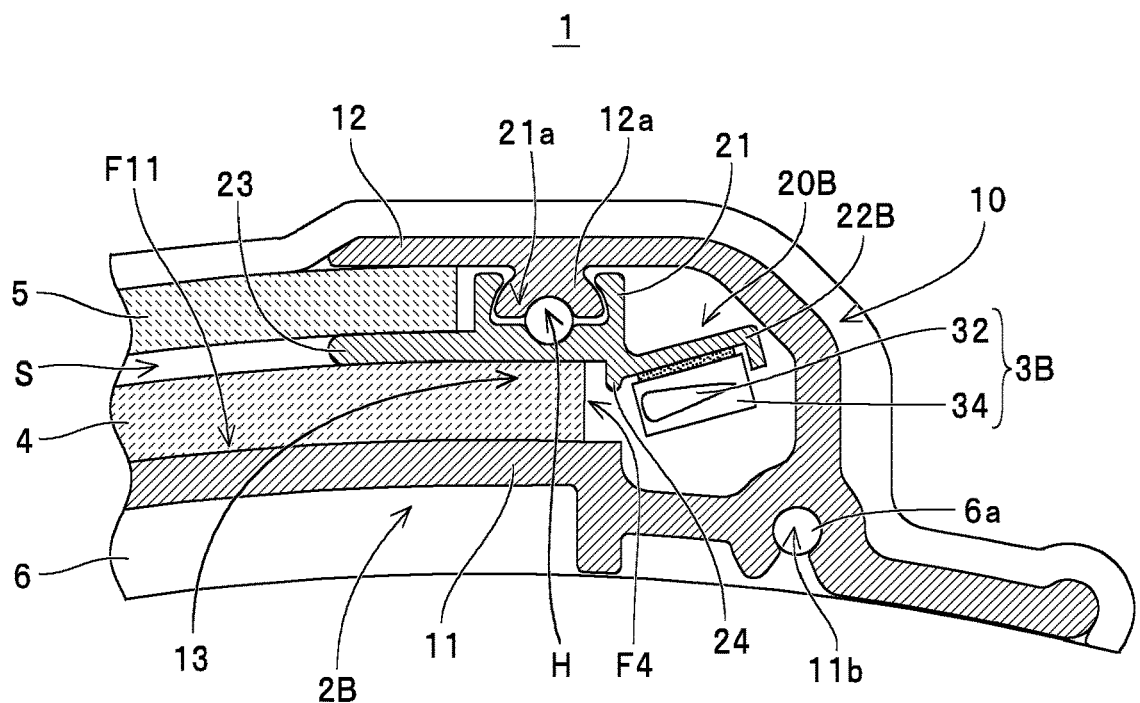
FIG. 11 A cross-sectional view of a signboard apparatus 1 equipped with another LED mount 20B.

Also, for the signboard apparatus 1 depicted in FIG. 11, since LED boards 3B whose emission direction of light differs to the LED boards 3 and 3A described earlier are used, a substrate 2B is configured using LED mounts 20B equipped with board mounting portions 22B of a different form to the board mounting portions 22 of the LED mounts 20 and the board mounting portions 22A of the LED mounts 20A. Here, the LED boards 313 described above are molded by a molding member 34 in a state where a plurality of LEDs 32 and protective components 33, not illustrated, are connected to one another, and have the overall form of long strips.

In the same way as in these examples, with the signboard apparatus 1, by fabricating the LED mounts 20, 20A, 20B, . . . in keeping with the "strip-like light source" in use, it is possible to manufacture signboard apparatuses 1 equipped with various "strip-like light sources" but which use the same main member 10, the light guide plate 4, the cover plate 5, and the caps 6. Note that since the LED mounts 20, 20A, 20B, and the like described above are smaller than the main member 10 and the various component elements of the LED mounts 20, 20A, 208, and the like are thinner than the main body 11 and the like of the main member 10, molds for extrusion molding the LED mounts 20, 20A, 20B, and the like can be fabricated at lower cost than the mold for extrusion molding the main member 10.

In this way, with the signboard apparatus 1, the substrates 2, 2A and 28 are configured so as to include the main body 11 and the pair of edge plates 12 provided at both ends in the width direction of the main body 11, to have the pair of insertion channels 13 formed so that the light guide plate 4 can be inserted thereinto, and to include the LED mounts 20, 20A, and 20B that are formed separately to the main body 11 and the edge plates 12, have the LED boards 3, 3A, and 3B mounted thereupon, and are fixed to the edge plates 12 in a state where the LED mounts 20, 20A, and 20B are disposed inside the insertion channels 13.

Therefore, according to the signboard apparatus 1, since it is possible to position the LED boards 3, 3A, 3B by first mounting the LED boards 3, 3A, 3B in advance on the LED mounts 20, 20A, and 20B and then mounting the LED mounts 20, 20A, and 20B on the edge plates 12, it is possible, even for workers unused to assembling this type of apparatus, to manufacture the signboard apparatus 1 easily and in a short time. By doing so, it is possible to sufficiently reduce the manufacturing cost of the signboard apparatus 1. When using various LED boards 3, 3A, and 3B that differ in size or the like, by fabricating the LED mounts 20, 20A, and 20B in keeping with the boards 3, 3A, and 38, it is possible to manufacture signboard apparatuses 1 that use the same main member 10 (the main body 11 and the edge plates 12) whose component cost is quite high. This means that it is possible to significantly reduce the manufacturing cost of the signboard apparatus 1 by an amount saved by not needing to fabricate a new "substrate" in keeping with the "strip-like light sources" in use.

Also, according to the signboard apparatus 1, by providing the movement restricting convex portions 24, which construct "movement restricting steps" that restrict movement in the width direction of the light guide plate 4 relative to the substrates 2, 2A, and 2B, on the LED mounts 20, 20A, and 20B, since the end surfaces F4 will not come into contact with the LED boards 3, 3A, and 313 even when the light guide plate 4 tries to move relative to the substrate 2, 2A, and 2B due to vibration or an external shock applied to the signboard apparatus 1, it is possible to favorably avoid the LED boards 3, 3A and 3B being broken by the light guide plate 4.

In addition, according to the signboard apparatus 1, by providing the cover plate 5 that acts together with the light guide plate 4 to hold the "display medium" and forming the insertion channels 13 into which the light guide plate 4 and the cover plate 5 can be inserted on the substrates 2, 2A, and 2B, it is possible to favorably avoid wetting and damage to the "display medium" covered by the cover plate 5 and, compared to a configuration where the cover plate 5 is disposed on the front side of the edge plates 12 (for example, a configuration where fixing screws inserted through the cover plate 5 are screwed into the edge plates 12 to fix the cover plate 5 in a state where end surfaces of the cover plate 5 are visible), it is possible to sufficiently improve the appearance of the signboard apparatus 1 and to favorably avoid accidents where the cover plate 5 comes off due to vibration or an external shock applied to the signboard apparatus 1.

Also, according to the signboard apparatus 1, the main body 11 is curved so that the cross-sectional form in the width direction forms an arc and the light guide plate 4 is curved along the surface on the front side of the main body 11, which makes it possible to mount the signboard apparatus 1 around the circumferential surface of a cylindrical (or barrel-shaped) mounted object X. By doing so, it is possible, without affecting the appearance or functioning of the mounted object X, to produce an eye-catching display where it appears as if part of the circumferential surface of the mounted object X (i.e., the part where the signboard apparatus 1 is mounted) is emitting light. Although assembly work may appear difficult due to the entire form being curved, since mounting on the substrate 2, 2A, and 2B is possible by mounting the LED mounts 20, 20A, and 20B, onto which the LED boards 3, 3A and 3B have been mounted in advance, on the edge plates 12 and then inserting both ends of the light guide plate 4 into the insertion channels 13, it is possible, even for workers unused to the task, to manufacture the signboard apparatus 1 easily and in a short time.

Also, according to the signboard apparatus 1, by providing the holding ribs 23, which are positioned between the light guide plate 4 and the cover plate 5, act together with the main body 11 to hold the light guide plate 4 and also act together with the edge plates 12 to hold the cover plate 5, on the LED mounts 20, 20A, and 20B, it is possible to reliably separate the light guide plate 4 and the cover plate 5 by the thickness of the holding ribs 23 to produce the gap S between the light guide plate 4 and the cover plate 5, which makes it possible to smoothly insert the "display medium" into the gap S.

Next, another embodiment of a "display apparatus" will be described.

Although the signboard apparatus 1 equipped with the main body 11, the light guide plate 4, and the cover plate 5 that are curved so that the cross-sectional form in the width direction forms an arc has been described above as an example of a "display apparatus", it is also possible to configure a "display apparatus" equipped with a "base portion" having a "main body" in the form of a flat plate, a "light guide plate" in the form of a flat plate, and a "surface plate" in the form of a flat plate.

Figure 12:
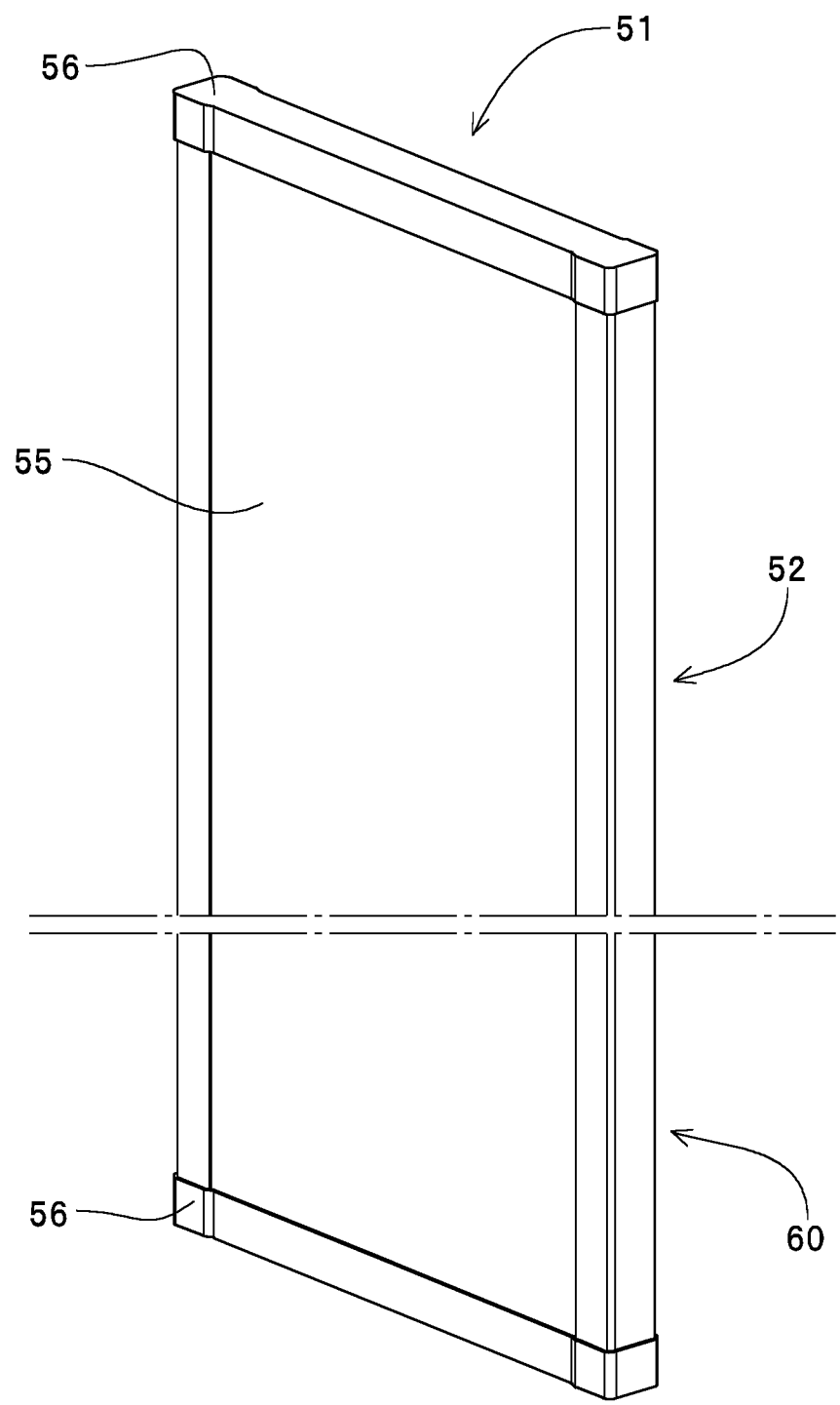
FIG. 12 An external perspective view of another signboard apparatus 51.
Figure 13:
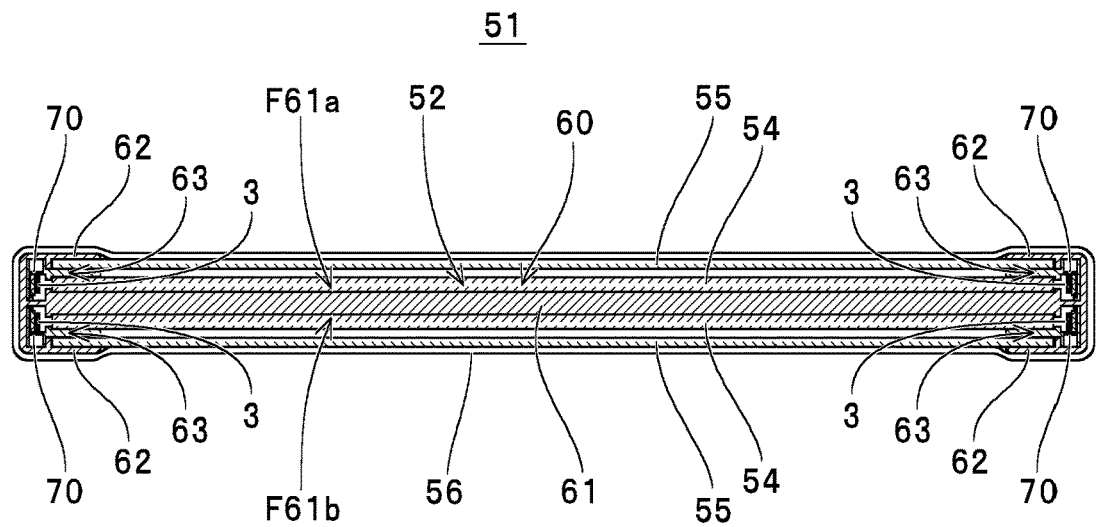
FIG. 13 A cross-sectional view of the other signboard apparatus 51.
Figure 14:
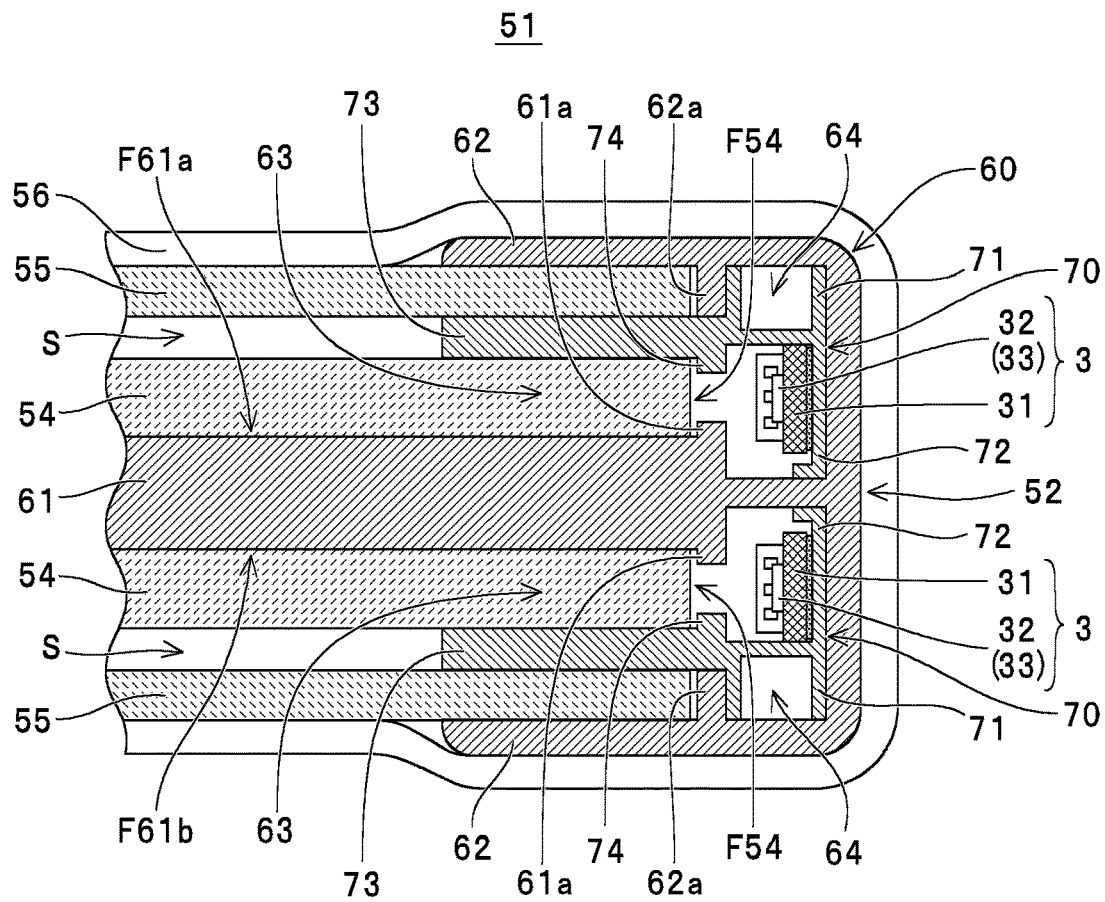
FIG. 14 A cross-sectional view of a part at an end portion in a width direction of the other signboard apparatus 51.
Figure 15:
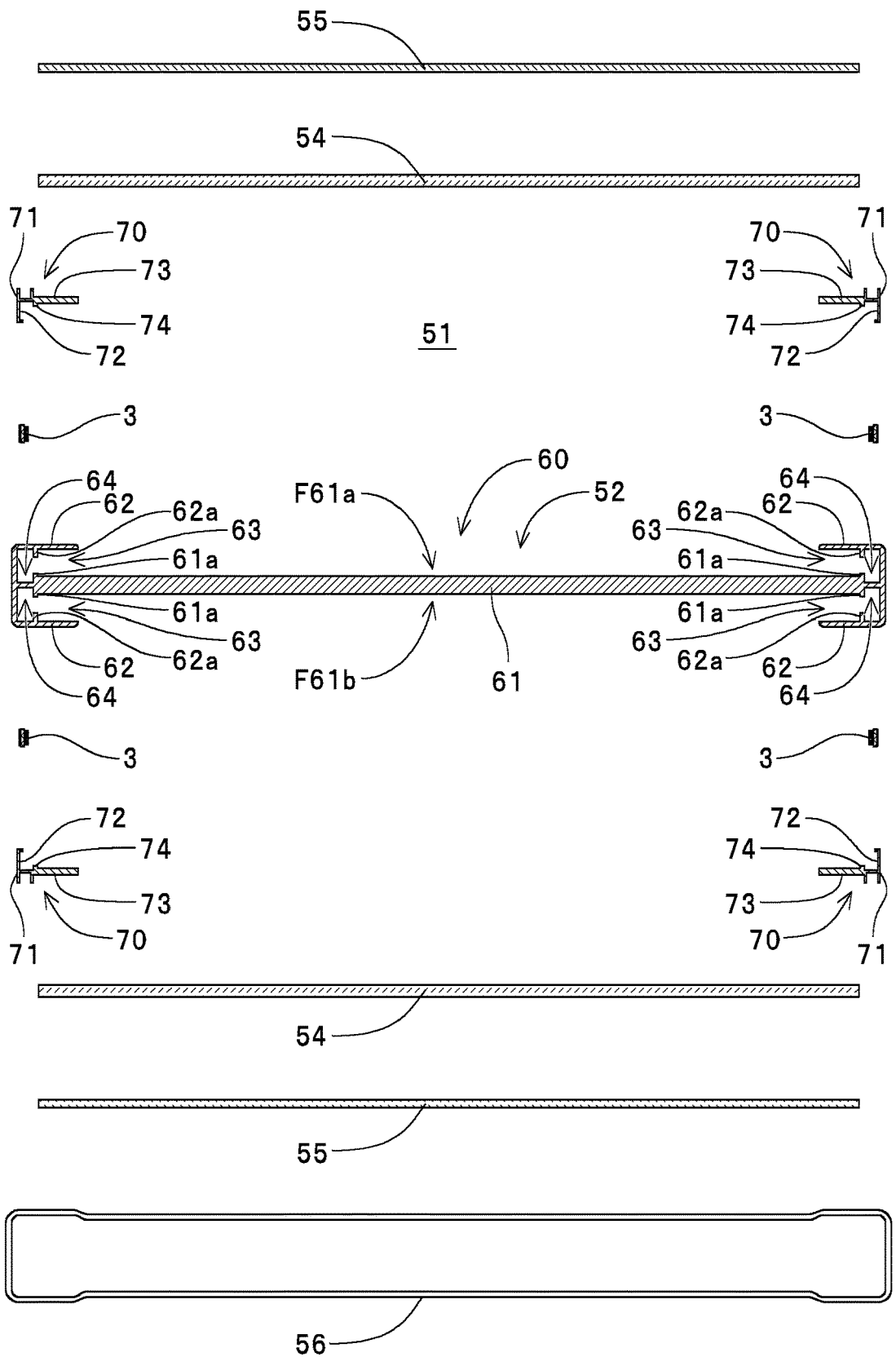
FIG. 15 An exploded perspective view of the other signboard apparatus 51.

As one example, a signboard apparatus 51 depicted in FIG. 12 is another example of a "display apparatus" and is configured so as to be capable of being used in a state where the signboard apparatus 51 is set on a stand (holder), not illustrated, and is freestanding on an arbitrary flat surface. The signboard apparatus 51 is also configured so that display media (advertising media) are set on both a first surface and a second surface and are displayed so as to be illuminated from their respective rear surfaces (i.e., from the inside of the signboard apparatus 51). As depicted in FIGS. 13 to 15, the signboard apparatus 51 includes a substrate 52, four LED boards 3, a pair of light guide plates 54, a pair of cover plates 55, a pair of caps 56, and a controller unit, not illustrated, that supplies power to (i.e., controls illumination of) the LED boards 3.

The substrate 52 is another example of a "substrate" for the present invention and has the overall form of a rectangular plate when viewed from in front. The substrate 52 includes a main member 60 and four LED mounts 70. The main member 60 is configured so that a main body 61 and edge plates 62 provided at both ends of surfaces F61$a$ and F61$b$ of the main body 61 are integrally formed by extrusion molding using aluminum.

The main body 61 is another example of a "main body" for the present invention and is formed as a rectangular plate (an elongated flat plate) when viewed from in front. Here, with the signboard apparatus 51 (the substrate 52) according to the present embodiment, the surfaces F61$a$ and F61$b$ of the main body 61 are provided with a mirror finish or given a white coating and by doing so, are configured to reflect light, which has been guided by the light guide plates 54, described later, and emitted toward rear sides of the light guide plates 54, back toward the first surface and the second surface of the signboard apparatus 51.

The edge plates 62 are another example of "edge plates" for the present invention, and are formed at both ends in the width direction of the surfaces F61$a$ and F61$b$ of the main body 61 so as to cover the front sides of both ends in the width direction of the light guide plates 54 and the cover plates 55. Here, with the signboard apparatus 51 (the substrate 52) according to the present embodiment, the insertion channels 63 that correspond to "insertion channels" for the present invention are formed by the ends in the width direction of the main body 61 described above and the edge plates 62.

With the signboard apparatus 51 (the substrate 52) according to the present embodiment, as depicted in FIG. 14, mounting portions 64 for attaching the LED mounts 70 are respectively formed inside the insertion channels 63 by the ends in the width direction of the main body 61, the edge plates 62, convex portions 61$a$ formed on the surfaces F61$a$ and F61$b$ of the main body 61, and convex portions 62$a$ formed on inner surfaces of the edge plates 62.

The LED mounts 70 are another example of "light source mounts" for the present invention and are formed separately to the main member 60 (the main body 61 and the edge plates 62) by extrusion molding using aluminum. As depicted in FIG. 14, with the LED mounts 70, mounting portions 71 for mounting in the mounting portions 64, board mounting portions 72 on which the LED boards 3 can be mounted, holding ribs 73 that are sandwiched between the light guide plates 54 and the cover plate 55 as described later, and movement restricting convex portions 74 that construct the "movement restricting steps" for the present invention are integrally formed. Note that with the LED mounts 70 according to the present embodiment, the board mounting portions 72 are formed by making use of part of the mounting portions 71.

The LED mounts 70 are fixed to the main member 60 so that the mounting portions 71 are fitted into the mounting portions 64 inside the insertion channels 63 in a state where the LED boards 3 have been attached to the board mounting portions 72 as described later (a configuration that is "fixed to both the main body and the edge plates" as one example of a configuration that is "fixed to at least one of the main body and the edge plates").

The light guide plates 54 are another example of "light guide plates" for the present invention and are formed as rectangular plates (elongated flat plates) when viewed from in front. As depicted in FIG. 13, the light guide plates 54 are disposed along the surfaces F61a and F61b of the main body 61 of the substrate 52 and guide light emitted from the LED boards 3 to every position in the width direction of the substrate 52. Here, as depicted in FIG. 14, the light guide plates 54 are mounted on the substrate 52 in a state where both ends in the width direction are inserted inside the insertion channels 63 so that light from the LED boards 3, which are disposed inside the insertion channels 63 having been mounted on the LED mounts 70, becomes incident from end surfaces F54.

The cover plates 55 are another example of "surface plates" for the present invention, are formed as rectangular plates (elongated flat plates) when viewed from in front in the same way as the light guide plates 54 described above, and, as depicted in FIG. 13, are mounted on the substrate 52 having been disposed on the front (i.e., outer) sides of the light guide plates 54 so as to be capable of acting together with the light guide plates 54 to hold the display media. In this case, with the signboard apparatus 51 according to the present embodiment, insertion channels 63 are formed so that the ends of both the light guide plates 54 and the cover plates 55 can be inserted.

The caps 56 are configured so as to be capable of covering the ends in the length direction of the substrate 52 (the main member 60 and the LED mounts 70), the LED boards 3, the light guide plates 54, and the cover plates 55. Note that although the signboard apparatus 51 according to the present embodiment uses a configuration where the caps 56 are fixed to the main member 60 of the substrate 52 by fixing screws, description and illustration of the fixing screws have been omitted.

When manufacturing the signboard apparatus 51, the main member 60 and the LED mounts 70 are separately fabricated by extrusion molding. The light guide plates 54 and the cover plate 55 are separately fabricated by cutting flat resin plates of an arbitrary thickness into rectangular shapes, and the caps 56 are fabricated by injection molding. Note that in the following explanation, detailed description of steps that are the same as in the manufacturing procedure of the signboard apparatus 1 described earlier has been omitted.

Next, the LED boards 3 are mounted on the board mounting portions 72 of the LED mounts 70. When doing so, unlike when the manufacturing of a conventional display apparatus where it is necessary to insert the LED light sources inside extremely narrow spaces, it is possible to fix the LED boards 3 to the LED mounts 70 by sticking (with tape or adhesive) the LED boards 3 to the board mounting portions 72 in an exposed (pre-assembly) state, which means it is possible even for workers unused to this type of task to complete the work easily and in a short time without breaking the LED boards 3.

Next, the mounting portions 71 are fitted into the mounting portions 64 from ends in the length direction of the main member 60 to house the LED mounts 70 inside the insertion channels 63. By doing so, the LED mounts 70 are fixed to the main member 60 to complete the substrate 52 and complete the mounting of the LED boards 3 onto the substrate 52.

After this, the light guide plates 54 are mounted on the substrate 52 by inserting both ends in the width direction into the insertion channels 63. When doing so, the light guide plates 54 are mounted so as to be inserted between the main body 61 of the main member 60 and the holding ribs 73 of the LED mounts 70. Here, with the signboard apparatus 51 (the substrate 52) according to the present embodiment, "movement restricting steps" are formed by the movement restricting convex portion 74 formed on the LED mounts 70 and the convex portions 61a formed on the main body 61 of the main member 60, and by doing so, movement in the width direction of the light guide plates 54 relative to the substrate 52 is restricted. Accordingly, a situation where the end surfaces F54 of the light guide plates 54 come in to contact with the LED boards 3 attached to the LED mounts 70 (the board mounting portions 72) and break the LED boards 3 is favorably avoided.

Next, the cover plates 55 are mounted on the substrate 52 so that both ends in the width direction are inserted into the insertion channels 63 of the substrate 52. When doing so, the cover plates 55 are mounted by being inserted between the edge plates 62 of the main member 60 and the holding ribs 73 of the LED mounts 70. After this, the caps 56 are attached to both ends in the length direction of the substrate 52, the LED boards 3, the light guide plates 54, and the cover plates 55. By doing so, the signboard apparatus 51 is completed as depicted in FIGS. 12 to 14.

When using the signboard apparatus 51, one of the two caps 56 is removed and display media are inserted into the gaps S between the light guide plates 54 and the cover plate 55. With the above configuration, since the gaps S that are equal to the thickness of the holding ribs 73 of the LED mounts 70 are formed between the light guide plates 54 and the cover plates 55, it is possible to smoothly insert the display media into the gaps S. Next, the cap 56 that was removed is reattached to the substrate 52 (the main body 61). By inserting the display media in this way, it becomes possible to have light emitted from the LED boards 3 and guided by the light guide plates 54 illuminate the display media from the rear sides thereof (i.e., from the inside of the signboard apparatus 51).

Note that although omitted from the drawings and the detailed description, when manufacturing a "display apparatus" using "strip-like light sources" whose emission direction (or light dispersing characteristics) differs to the LED boards 3 of the signboard apparatus 51 described above or "strip-like light sources" whose size (width and/or thickness) differs to the LED boards 3, or when replacing the LED boards 3 of the signboard apparatus 51 with such "strip-like light sources", "light source mounts" that suit the "strip-like light sources" in use are used. By doing so, in the same way as the signboard apparatus 1 described earlier, it is possible to manufacture signboard apparatuses 51 equipped with various "strip-like light sources" that use "light source mounts" fabricated in keeping with the "strip-like light sources" in use but which use the same main member 60, the light guide plates 54, the cover plates 55, the caps 56, and the like.

In this way, with the signboard apparatus 51, the substrate 52 is configured so as to include the main body 61 and the pair of edge plates 62 provided at both ends in the width direction of the main body 61, to have the pair of insertion channels 63, into which the light guide plates 54 can be inserted, formed on the first surface and the second surface (i.e., a double-sided configuration where both the front and rear surfaces correspond to a "front surface" for the present invention), and to include the LED mounts 70 that are formed separately to the main body 61 and the edge plates 62, have the LED boards 3 and the like mounted thereupon, and are fixed to the mounting portions 64 (the main body 61 and the edge plates 62) in a state where the LED mounts 70 are disposed inside the insertion channels 63.

Therefore, according to the signboard apparatus 51, since it is possible to position the LED boards 3 by first mounting the LED boards 3 in advance on the LED mounts 70 and then mounting the LED mounts 70 on the mounting portions 64, it is possible, even for workers unused to assembling this type of apparatus, to manufacture the signboard apparatus 51 easily and in a short time. By doing so, it is possible to sufficiently reduce the manufacturing cost of the signboard apparatus 51. When using various LED boards (strip-like light sources) that differ in size or the like, by fabricating LED mounts (light source mounts) in keeping with the LED boards, it is possible to manufacture signboard apparatuses 51 that use the same main member 60 (the main body 61 and the edge plates 62) whose component cost is quite high. This means that it is possible to significantly reduce the manufacturing cost of the signboard apparatus 51 by an amount saved by not needing to fabricate a new substrate in keeping with the strip-like light sources in use.

Also, according to the signboard apparatus 51, by providing, on the LED mounts 70, the movement restricting convex portions 74 that construct "movement restricting steps" for the present invention that restrict movement in the width direction of the light guide plates 54 relative to the substrate 52, the end surfaces F54 of the light guide plates 54 are prevented from coming into contact with the LED boards 3 even when the light guide plates 54 try to move relative to the substrate 52 due to vibration or an external shock applied to the signboard apparatus 51, which makes it possible to favorably avoid the LED boards 3 being broken by the light guide plates 54.

In addition, according to the signboard apparatus 51, by including the cover plates 55 that act together with the light guide plates 54 to hold the "display media" and forming the insertion channels 63 into which the light guide plates 54 and the cover plates 55 can be inserted on the substrate 52, it is possible to favorably avoid wetting and damage to the "display media" that are covered by the cover plates 55 and, compared to a configuration where the cover plates 55 are disposed on the front (outer) sides of the edge plates 62 (for example, a configuration where fixing screws inserted through the cover plates 55 are screwed into the edge plates 62 to fix the cover plates 55 in a state where end surfaces of the cover plates 55 are visible), it is possible to sufficiently improve the appearance of the signboard apparatus 51 and to favorably avoid accidents where the cover plates 55 come off due to vibration or an external shock applied to the signboard apparatus 51.

Also, according to the signboard apparatus 51, by providing the holding ribs 73, which are positioned between the light guide plates 54 and the cover plates 55, act together with the main body 61 to hold the light guide plates 54, and act together with the edge plates 62 to hold the cover plates 55, on the LED mounts 70, it is possible to reliably separate the light guide plates 54 and the cover plates 55 by the thickness of the holding ribs 73 to produce the gaps S between the light guide plates 54 and the cover plates 55, which make it possible to smoothly insert the "display media" into the gaps S.

Note that the configuration of the "display apparatus" is not limited to the example configurations of the signboard apparatuses 1 and 51 described above. As one example, although the signboard apparatus 1 where the LED boards 3, 3A, and 3B are disposed between both ends of the substrates 2, 2A, and 2B and the signboard apparatus 51 where the LED boards 3 are disposed at both ends of the substrate 52 have been described as examples, it is also possible, in cases such as when a sufficient amount of light can be emitted from a single "strip-like light source" and/or when the width of the "substrate" is narrow, to configure a "display apparatus" (not illustrated) by disposing a strip-like light source at only one of the two ends in the width direction of the "substrate".

Also, although the substrate 2, which includes the main member 10 where the main body 11 and the edge plates 12 are integrally formed by extrusion molding, and the substrate 52, which includes the main member 60 where the main body 61 and the edge plates 62 are integrally formed by extrusion molding, have been described as examples, it is also possible to use a configuration where the "main body" and the "edge plates" are separately formed and then integrated by welding, screwing together, fitting together, or the like.

In addition, although the signboard apparatus 1 (the substrate 2) that uses a configuration where the LED mounts 20 are fixed to the edge plates 12 and the signboard apparatus 51 (the substrate 52) that uses a configuration where the LED mounts 70 are fixed to the mounting portions 64 constructed by the main body 61 and the edge plates 62 (i.e., a configuration where the LED mounts 70 are fixed to both the main body 61 and the edge plates 62), have been described as examples, it is also possible to use a configuration (not illustrated) where the "light source mounts" are fixed to the "main body".

The construction that fixes the "light source mounts" to the "main body" and/or the "edge plates" is not limited to the examples of a configuration like the substrates 2, 2A, and 2B where the mounting convex portions 12a are fitted into the mounting concave portions 21a and fixed by headless screws and a configuration like the substrate 52 where the mounting portions 71 are fitted into the mounting portions 64, and it is also possible to use a configuration where the "light source mounts" are fixed by screws that pass through the main body and/or the edge plates and a configuration where the "light source mounts" are fixed using adhesive (neither configuration is illustrated).

In addition, for uses in environments where there is no risk of the "display media" getting wet and when the "display media" are fabricated using a water-resistant material, it is possible to omit the "surface plates" (i.e., the cover plates 5 and 55) and leave "display media" that have been stuck onto the front sides of the light guide plates 4 and 54 exposed. Also, although an example of a configuration equipped with the LED boards 3, 3A, and 35 including the LEDs 32 have been described as examples, it is possible to configure a "display apparatus" that uses various types of "strip-like light source" equipped with light sources such as fluorescent tubes.

In addition, although the configuration of the signboard apparatus 1 which is capable of being mounted on a mounted object X such as a utility pole has been described as an example, it is also possible to configure a display apparatus capable of uses such as mounting along the corner of a ceiling in a railway carriage or a passageway. Here, when the display apparatus is used by being attached to a ceiling corner, the direction of curvature of the "substrate", the "light guide plate", the "surface plate" and the like may be the opposite to the signboard apparatus 1 (not illustrated). Also, although the signboard apparatus 51 configured so that "display media" can be disposed on both the first surface and the second surface has been described as an example, it is also possible to use a configuration where a "display medium" is disposed on only one of the first and second surfaces (not illustrated).

INDUSTRIAL APPLICABILITY

The present invention is broadly applicable to a display apparatus configured so that light emitted from a strip-like light source disposed at an edge in the width direction of a substrate, which is shaped as a rectangular plate when viewed from in front, is guided to every position in the width direction of the substrate by a light guide plate and passes through a display medium disposed on a front side of a light guide plate.

DESCRIPTION OF REFERENCE NUMERALS 1, 51 signboard apparatus
2, 2A, 2B, 52 substrate
3, 3A, 3B LED board
4, 54 light guide plate
5, 55 cover plate
6, 56 cap
11, 61 main body
12, 62 edge plate
12a mounting convex portion
13, 63 insertion channel
20, 20A, 20B, 70 LED mount
21, 71 mounting portion
21a mounting concave portion
22, 22A, 22B, 72 board mounting portion
23, 73 holding rib
24, 74 movement restricting convex portion
64 mounting portion
74 movement restricting convex portion
F4, F54 end surface
F11, F61a, F61b surface
S gap

The invention claimed is:
1. A display apparatus comprising:
a substrate shaped as a rectangular plate when viewed from a front side thereof;
a strip-like light source mounted on at least one out of both ends in a width direction of the substrate; and
a light guide plate which is disposed across a front surface of the substrate, is mounted on the substrate, and guides light emitted from the strip-like light source to every part in the width direction of the substrate;
wherein the display apparatus is configured so that a display medium is capable of being disposed on a front surface side of the light guide plate,
the substrate includes:
a main assembly; and
a light source mount, which is formed separately from the main assembly and is capable of having a strip-like light source mounted thereupon,
the main assembly includes:
a main body that is shaped as a rectangular plate when viewed from a front side thereof; and
a pair of edge plates that are provided at both ends in a width direction of the main body and cover the front surface side of both ends in a width direction of the light guide plate,
both ends of the main body and both edge plates form a pair of insertion channels into which the light guide plate is capable of being inserted,
the light source mount is inserted into the insertion channels in a longitudinal direction of the main assembly, thereby being fitted and fixed to the main assembly, and
the light guide plate is mounted on the substrate in a state where both ends in the width direction have been inserted inside the insertion channels in a state where light from the strip-like light source mounted on the light source mount is incident from end surfaces in the width direction of the light guide plate.
2. The display apparatus according to claim 1, wherein the light source mount is equipped with a movement restricting step that restricts movement in the width direction of the light guide plate relative to the substrate.
3. The display apparatus according to claim 2, further comprising a surface plate that is disposed across the front surface side of the light guide plate and acts together with the light guide plate to hold the display medium,
wherein the insertion channels of the substrate are formed so that both the light guide plate and the surface plate are capable of being inserted.
4. The display apparatus according to claim 3, wherein the light source mounts is provided with a holding rib that is positioned between the light guide plate and the surface plate, acts together with the main body to hold the light guide plate, and acts together with the edge plates to hold the surface plate.
5. The display apparatus according to claim 2, wherein a cross-sectional form in the width direction of the main body is curved into an arc, and
the light guide plate is curved across the front surface of the main body.
6. The display apparatus according to claim 5, further comprising a surface plate that is curved in a width direction thereof, is disposed across the front surface side of the light guide plate, and acts together with the light guide plate to hold the display medium, and
the insertion channels of the substrate are formed so that both the light guide plate and the surface plate are capable of being inserted.
7. The display apparatus according to claim 6, wherein the one light source mounts is provided with a holding rib that is positioned between the light guide plate and the surface plate, acts together with the main body to hold the light guide plate, and acts together with the edge plates to hold the surface plate.
8. The display apparatus according to claim 1, further comprising a surface plate that is disposed across the front surface side of the light guide plate and acts together with the light guide plate to hold the display medium, wherein the insertion channels of the substrate are formed so that both the light guide plate and the surface plate are capable of being inserted.

9. The display apparatus according to claim 8, wherein the light source mounts is provided with a holding rib that is positioned between the light guide plate and the surface plate, acts together with the main body to hold the light guide plate, and acts together with the edge plates to hold the surface plate.

10. The display apparatus according to claim 1, wherein a cross-sectional form in the width direction of the main body is curved into an arc, and the light guide plate is curved across the front surface of the main body.

11. The display apparatus according to claim 10, further comprising a surface plate that is curved in a width direction thereof, is disposed across the front surface side of the light guide plate, and acts together with the light guide plate to hold the display medium, and the insertion channels of the substrate are formed so that both the light guide plate and the surface plate are capable of being inserted.

12. The display apparatus according to claim 11, wherein the one light source mounts is provided with a holding rib that is positioned between the light guide plate and the surface plate, acts together with the main body to hold the light guide plate, and acts together with the edge plates to hold the surface plate.

\* \* \* \* \*